United States Patent
Chindalore et al.

(10) Patent No.: US 6,760,270 B2
(45) Date of Patent: Jul. 6, 2004

(54) ERASE OF A NON-VOLATILE MEMORY

(75) Inventors: Gowrishankar L. Chindalore, Austin, TX (US); James David Burnett, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 58 days.

(21) Appl. No.: 10/260,970

(22) Filed: Sep. 30, 2002

(65) Prior Publication Data

US 2004/0062118 A1 Apr. 1, 2004

(51) Int. Cl.[7] ............................. G11C 7/00
(52) U.S. Cl. ............... 365/218; 365/185.29; 365/185.3; 365/185.24
(58) Field of Search ............... 365/218, 185.29, 365/185.24, 185.3

(56) References Cited

U.S. PATENT DOCUMENTS

| | | | | |
|---|---|---|---|---|
| 4,958,321 A | * | 9/1990 | Chang | 365/185.3 |
| 5,060,195 A | * | 10/1991 | Gill et al. | 365/185.06 |
| 5,808,937 A | * | 9/1998 | Chi et al. | 365/185.33 |
| 5,901,084 A | * | 5/1999 | Ohnakado | 365/185.18 |
| 5,953,255 A | * | 9/1999 | Lee | 365/185.29 |
| 6,232,631 B1 | * | 5/2001 | Schmidt et al. | 257/315 |
| 6,469,935 B2 | * | 10/2002 | Hayashi | 365/185.18 |
| 6,477,088 B2 | * | 11/2002 | Ogura et al. | 365/185.29 |
| 6,631,088 B2 | * | 10/2003 | Ogura et al. | 365/185.18 |
| 2002/0008993 A1 | * | 1/2002 | Hayashi | 365/185.18 |
| 2002/0067641 A1 | * | 6/2002 | Ogura et al. | 365/185.29 |

* cited by examiner

Primary Examiner—Viet Q. Nguyen
(74) Attorney, Agent, or Firm—James L. Clingan, Jr.; David G. Dolezal

(57) ABSTRACT

An erase of a non-volatile memory (NVM) is achieved by first using oxide tunneling followed by hot hole injection (HHI). The subsequent use of HHI completes the erase that the tunneling cannot complete due to saturation. By first using tunneling, preferably Fowler-Nordheim tunneling (FNT), the damage to a bottom dielectric that normally occurs by HHI is significantly reduced. The damage due to HHI is significantly greater at the beginning of the erase when the electric field is greater. By reducing the damage due to HHI, the bottom dielectric can be smaller than that normally used for HHI so that high voltages are not required. Accordingly, the transistors in the periphery do not need to be so oversized as is normally required for HHI and thus saving area and power.

24 Claims, 2 Drawing Sheets

ERASE OF A NON-VOLATILE MEMORY

FIELD OF THE INVENTION

The present invention relates generally to memories, and more specifically, to the erase of a non-volatile memory.

RELATED ART

The erase of a non-volatile memory cell is significant in many characteristics of the memory. A typical erase in floating gate devices is Fowler-Nordheim tunneling (FNT). This does require higher voltages than the normal operating voltages, which in turn requires that the peripheral circuits be larger than would otherwise be required. For dielectric storage devices, SONOS (silicon-oxide-nitride-oxide-silicon) being the most common, a typical erase mechanism is hot hole injection (HHI). With dielectric storage memories, FNT erase is especially difficult to perform effectively because the erase process saturates before a sufficient level of erase has been achieved. To achieve FNT, a control gate to well voltage creates a bias voltage across the oxide immediately above the channel (bottom oxide) sufficient to cause electrons to tunnel from the nitride to the channel. This control gate to well voltage also creates a bias across the dielectric that is between the control gate and the nitride (top oxide). As the nitride is depleted of electrons the bias across the top oxide increases, eventually causing tunneling of electrons from the control electrode to the nitride through the top oxide. The electrons supplied to the nitride through the top oxide thus offsets the electrons being removed from the nitride. This is a particularly severe problem for nitride storage because the band gap of nitride is between that of oxide and silicon. Further, the electrons that can be removed are in traps in the nitride and require a higher voltage for them to pass through the oxide than for the case in which the storage element is a silicon floating gate. This saturation problem has made it very difficult to have an effective erase using FNT for dielectric storage devices.

For HHI erase, the bottom oxide must be made relatively thick because of the damage that is done to the bottom oxide by the HHI process. The greater thickness allows for this damage to occur, at least for a reasonable number of erases, without causing excessive leakage. This does ultimately effect the life of the device. The relatively thick bottom oxide results in the requirement of the larger voltages than for FNT using lesser thickness for the bottom oxide. This requirement for greater voltages results in the requirement for larger transistors in the peripheral circuitry. The larger voltages require longer gate lengths. For effective operation, the gate width to gate length ratios are important so that an increase in gate length requires a corresponding percentage increase in gate width. For example, a periphery may need to be 40 percent of the area of the memory array to meet the voltage requirements for HHI whereas a periphery for the voltages required for FNT may need to be only 20 percent of the area of the memory array. These larger device sizes also consume more power.

Thus, there is a need to have an erase of non-volatile memories that overcomes at least one and preferably more than one of these problems.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

An erase of a non-volatile memory (NVM) is achieved by first using oxide tunneling followed by hot hole injection (HHI). The subsequent use of HHI completes the erase that the tunneling cannot complete due to saturation. By first using tunneling, preferably Fowler-Nordheim tunneling (FNT), the damage to a bottom dielectric that normally occurs by HHI is significantly reduced. The damage due to HHI is significantly greater at the beginning of the erase when the electric field across the oxide is greater. By reducing the damage due to HHI, the bottom dielectric can be smaller than that normally used for HHI so that high voltages are not required. Accordingly, the transistors in the periphery do not need to be so oversized as is normally required for HHI and thus saving area and power. This is better understood by reference to the drawings and the following description.

Figure 1:
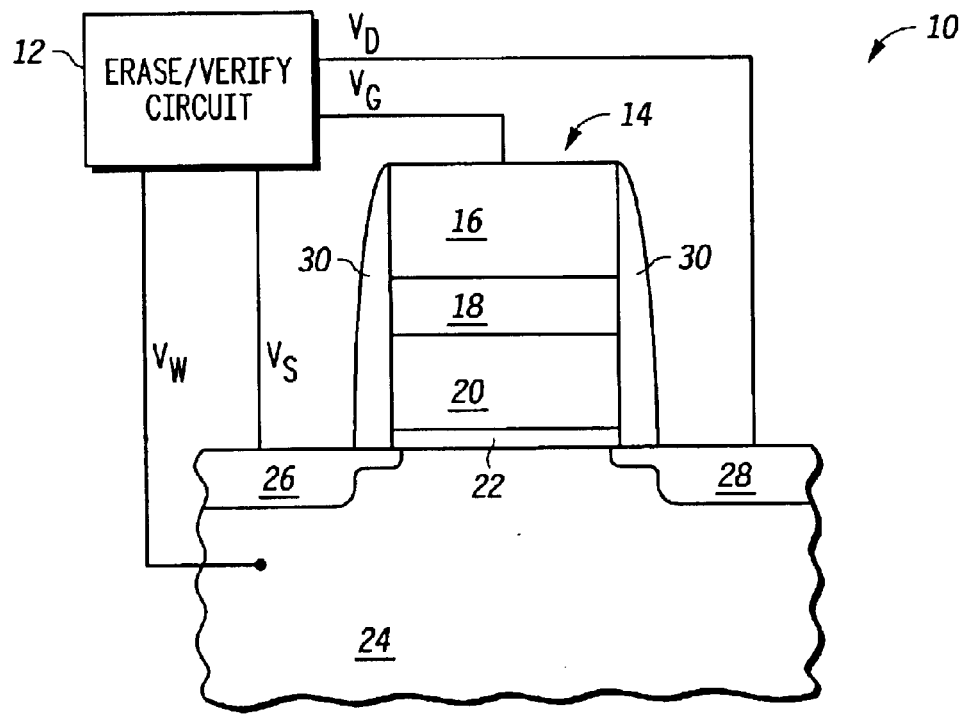
FIG. 1 is a combination device structure and block diagram of a portion of a memory performing an erase according a to an embodiment of the invention.

Shown in FIG. 1 is a memory 10 comprising an erase/verify circuit 12 and a memory cell 14. Memory cell 14 comprises a gate 16, a top dielectric 18, a storage layer 20, a bottom dielectric 22, a well 24, a source 26, a drain 28, and a sidewall spacer 30. Well 24 is the substrate area for a bulk transistor of the typical type for a SONOS memory cell. Well 24 is doped to P- and source and drain 26 and 28, respectively, are doped to N type. Storage dielectric 20 is used, by a net current flow in or out, to cause an effect on the threshold voltage (Vt), which determines if it is considered programmed or erased, of memory cell 14 that can be sensed. Erase circuit has an electrical connection to gate 16 having a voltage VG, to well 24 having a voltage VW, to source 26 having a voltage VS, and to drain 28 having a voltage VD. Dielectrics 18 and 22 are preferably oxide but can be other dielectric materials as well. In one embodiment, bottom dielectric 22 is 30 Angstroms, storage layer 20 is 60 Angstroms, and top dielectric 18 is 50 Angstroms. Storage layer 20 is preferably nitride but may be other storage material as well. Although best suited to overcome the problems associated with a memory using dielectric storage, the invention can also be used to benefit other non-volatile memories using other types of storage such as silicon nanocrystals. Thus storage layer 20 may include, for example, silicon nanocrystals and/or dielectric materials that are can store charge. The bottom dielectric can be thinner than 30 Angstroms but at the risk of increasing problems with read disturb.

Figure 2:
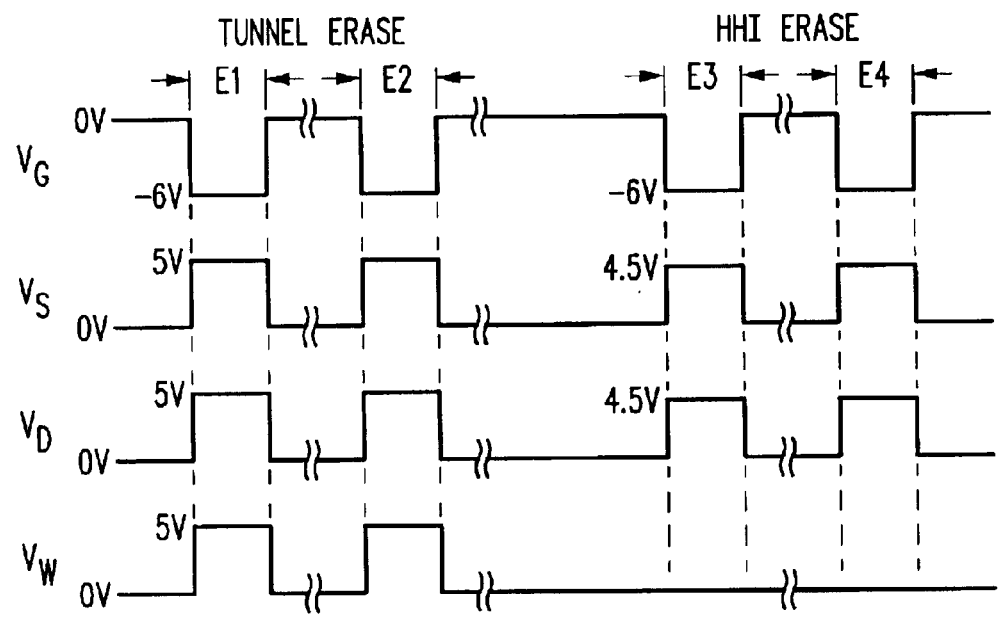
FIG. 2 is a timing diagram for showing erase voltages that can be applied to a memory cell shown in FIG. 1 according to one embodiment of the invention.
Figure 3:
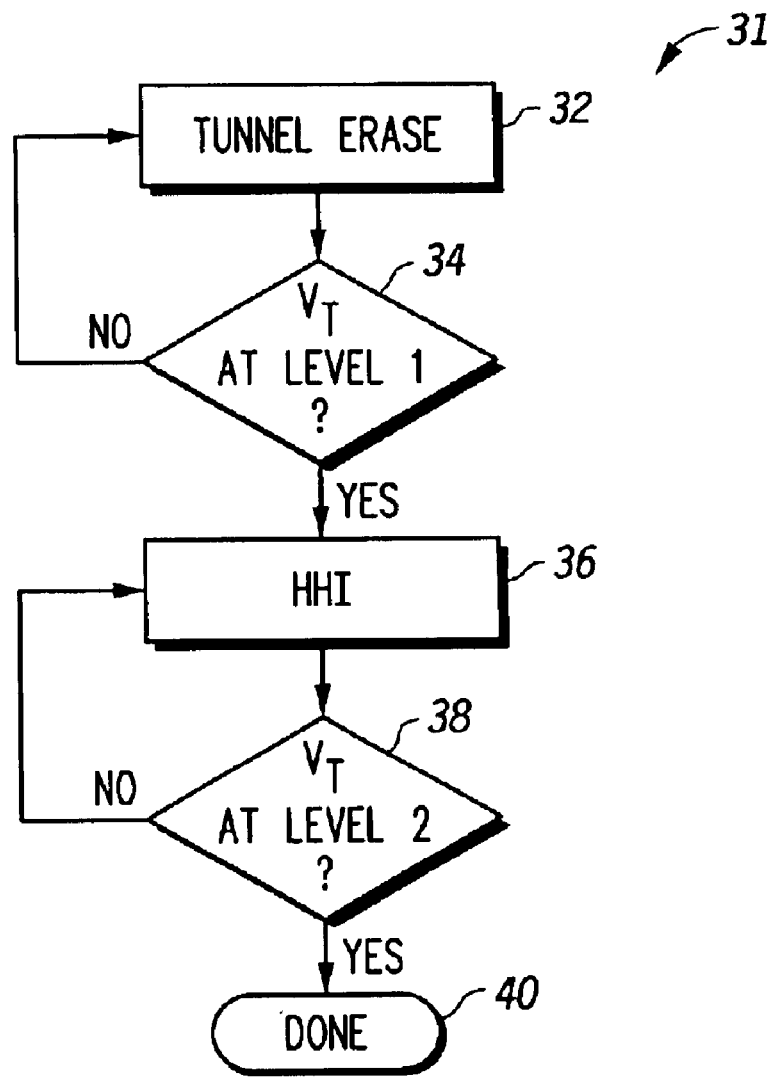
FIG. 3 is a flow chart consistent with the embodiment of the timing diagram of FIG. 2.

Shown in FIG. 2 are erase pulses as voltages VG, VW, VS, and VD at the beginning of an erase at time period E1, which also corresponds to step 32 of flow chart 31 shown in FIG. 3. FNT erase is achieved by applying −6 volts to gate 16 and 5 volts to source 26, drain 28, and well 24. This causes a bias from well 24 to storage layer 20 across bottom dielectric 22 sufficient to cause FNT so that electrons are removed from storage layer 20. After one pulse period E1, the FNT is stopped to determine if there has been sufficient erasing. This is typically achieved by measuring the threshold voltage. This step of verifying, shown as decision step 34 in FIG. 3, is accomplished by erase/verify circuit 12 as shown in FIG. 2 determining if a predetermined condition has been met. This a common step performed in erasing of non-volatile memories and would include sense amplifiers and decodes commonly present in a memory. Similarly, the erase voltages are achieved in any manner and that such manner would commonly include using row and column decoders and bias voltage generators. The particular technique would depend on a variety of factors including the architecture chosen. For example, the actual circuitry chosen would be different for an architecture that had byte erase than for an architecture that had row erase but not byte erase.

If the decision step determined that more erase was necessary, then the tunneling step 32 would be repeated. This is shown as time period E2 in FIG. 2. The same voltage levels are applied as in time period E1. After time period E2, another verification step is performed. This cycle between FNT step and verification step continues until the criteria is met for stopping FNT. There will be a point at which additional FNT steps will not result in additional electrons being removed from storage layer 20. This is the saturation point. Because of saturation, the desired threshold voltage will not be reached simply by FNT. Thus, after the benefit of FNT erase has been achieved, the erase continues with HHI erase.

The voltages applied to gate 16, well 24, source 26, and drain 28 are shown at time period E3 in FIG. 2. This is step 36 shown in FIG. 3. In this case pulses of duration E3 are provided at the gate with a voltage VG at −6 volts, well 24 with VW at ground (0 volts), source 26 with VS at 4.5 volts, and drain 28 with VD at 4.5 volts. The reverse bias between well 24 and source 26 and between well 24 and drain 28 generates hot holes that are attracted to the storage layer 20 by the negative voltage applied to gate 16. This causes the net positive charge in storage layer 20 that reduces the threshold voltage of memory cell 14 that causes it to be considered erased. The voltage pulses for this HHI step lasts for time period E3 and is then stopped for verification. In this case the ultimate desired erased Vt, level 2 in decision step 38, is desired. If level 2 has not been reached then another HHI step is performed. This is shown in FIG. 2 as time period E4. The voltage pulses are repeated as for time period E3. This cycle between verification and HHI erase is repeated until level 2 for the threshold voltage has been reached. After the desired Vt has been reached, then the erase is done as shown in block 40 of FIG. 3.

Thus, the benefit of being able to perform a sufficient amount of erase is achieved by using HHI erase while the damage done by HHI is significantly reduced by using FNT for the first part of erase. The most damaging part of HHI is when the storage layer is at its maximum negative potential. When the cell is in its programmed state, the storage layer 20 is at a negative potential. Thus, at the beginning of erasing, when the storage layer 20 is at its maximum negative potential, the voltage difference between the storage layer 20 and the source 26 and drain 28 is at its maximum as is the difference between the storage layer 20 and well 24. By making the storage layer 20 less negative by FNT, the voltage across the bottom dielectric is reduced during HHI. With this reduction in voltage across the bottom oxide there is then available a significant reduction in thickness for bottom dielectric 22 to a desirable range of approximately 25–35 Angstroms for oxide. This reduction in thickness of bottom dielectric results in lower voltages being required which in turn results in transistor sizes in the peripheral circuits being lower. The transistor size reduction results in lower power and less chip area required for the peripheral.

Often the whole array is erased at once. In such case there can be a significant amount of current flowing from the charge pump that supplies the erase operation. For the case of HHI only erase, the peak current would be at the beginning of the erase process, but for the present operation, the current at the beginning is with FNT which is much lower than for HHI. When the HHI is implemented, it is when the Vt has already been decreased. Thus, the peak current is much less when the HHI does become the mode used for erase.

There is very little sacrifice in speed of erasing using these sequential and differing types of erasure. The FNT is only used for the initial portion, when it is most effective. Also because FNT is only used at the beginning of the erase cycle, the bottom dielectric can be relatively thick compared to typical bottom oxides thought to be needed for FNT in SONOS. The HHI erase completes the erase relatively quickly but without causing significant damage to the bottom oxide. It is not necessary that FNT erase continue until saturation is reached. The erase period could simply be for a predetermined time followed by HHI erase. This would ensure that the Vt of the memory cell would have some reduction to achieve the benefits of that before beginning the HHI erase. This could result in the FNT being used only for the time that its erase rate is relatively high and then bring in HHI to complete the erase. In this case, the predetermined condition that the verification step would be looking for would be for the erase pulse lasting for the predetermined time. It would still be desirable to have verification during the HHI erase because it is desirable to reach a certain Vt for the erased state.

Also it may desirable to have differing pulse widths during either or both of FNT or HHI. As the desired Vt is approached, narrower pulse widths may provide more resolution in obtaining the desired Vt. Similarly the voltage levels may be increased as erase progresses to compensate for the reduction in electric field across the bottom dielectric as the storage layer becomes more positively charged.

Gate 16 may be a different material from polysilicon such as a metal. Metal gates are being studied due to their high conductivity. Similarly well 24 may be a semiconductor other than silicon. Well 24 can be part of a silicon on insulator structure or simply a substrate for the memory. Just a single memory cell has been shown as illustrative of the erase technique but an actual memory would have many cells arranged in rows and columns and erase/verify circuit would have column and row decoders, sense amplifiers, and other bias and control circuits.

Although the invention has been described with respect to specific conductivity types or polarity of potentials, skilled artisans appreciate that conductivity types and polarities of potentials may be reversed or shifted. For example the memory cell could be a transistor of P type in which case the polarities would be reversed. In another case the voltages could all be moved in the same direction to maintain the same voltage differentials. For example the gate voltage for period E1 could be at 0 volts and the substrate, source, and drain could be at 11 volts, i.e., 6 volts higher than shown in for period E1 in FIG. 2. Another alternative is, during FNT, to float the source and drain and only apply a bias voltage between the gate and well.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for erasing a storage charge in a non volatile memory cell transistor, the method comprising:
    performing a tunnel erase on the transistor; and
    performing a hot hole injection erase on the transistor after the performing the tunnel erase.

2. The method of claim 1 wherein the performing the tunnel erase on the transistor further includes:
    performing the tunnel erase on the transistor until a predetermined condition has been met.

3. The method of claim 2 wherein the performing the hot hole injection erase on the transistor further includes performing the hot hole injection erase on the transistor until a second predetermined condition has been met.

4. The method of claim 3 wherein the performing the hot hole injection erase on the transistor until the second predetermined condition has been met further includes:
    applying hot hole injection erase pulses on the transistor until the second predetermined condition has been met.

5. The method of claim 2 wherein:
    the performing the tunnel erase on the transistor until a predetermined condition has been met further includes performing the tunnel erase on the transistor for a predetermined period of time.

6. The method of claim 2 wherein the predetermined condition is indicative of an onset of a threshold voltage saturation during a tunnel erase of the transistor.

7. The method of claim 2 wherein:
    the performing the tunnel erase on the transistor until a predetermined condition has been met further includes performing the tunnel erase on the transistor until a threshold voltage of the transistor is equal to or less than a predetermined threshold voltage level.

8. The method of claim 7 wherein:
    the predetermined threshold voltage level is a threshold voltage of a reference transistor; and
    the performing the tunnel erase on the transistor until a predetermined condition has been met further includes performing the tunnel erase on the transistor until the threshold voltage of the transistor is equal to or less than the threshold voltage of a reference transistor.

9. The method of claim 2 wherein the performing the tunnel erase on the transistor until a predetermined condition has been met further includes:
    applying tunnel erase pulses on the transistor until the predetermined condition has been met.

10. The method of claim 2 wherein the performing the tunnel erase on the transistor until a predetermined condition has been met further includes:
    after each tunnel erase pulse, determining whether the predetermined condition has been met.

11. The method of claim 1 wherein the performing the tunnel erase on the transistor further includes:
    applying a first voltage level to a gate of the transistor; and
    applying a second voltage level to a source, a drain, and a well of the transistor;
    wherein the first voltage level is lower than the second voltage level.

12. The method of claim 1 wherein the performing the hot hole injection erase on the transistor further includes:
    applying a first voltage level to a gate of the transistor;
    applying a second voltage level to at least one of a source and a drain of the transistor; and
    applying a third voltage level to a well of the transistor;
    wherein the third voltage level is lower than the second voltage level;
    wherein the first voltage level is lower than then second voltage level.

13. The method of claim 1 wherein the transistor includes a storage layer for storing a storage charge, the storage layer including nitride.

14. The method of claim 1 wherein the transistor includes a storage layer for storing a storage charge, the storage layer including silicon nanocrystals.

15. The method of claim 1 wherein the transistor includes a gate oxide located below a storage layer of the transistor, the gate oxide having a thickness of between approximately 25 Angstrom to approximately 35 Angstrom.

16. A memory device comprising:
    a memory cell transistor including a storage layer; and
    means for erasing a storage charge in the storage layer of the memory cell by performing a tunnel erase on the transistor and performing a hot hole injection erase on the transistor after the performing tunnel erase.

17. The memory device of claim 16 wherein the storage layer includes nitride.

18. The memory device of claim 16 wherein the storage layer includes silicon nanocrystals.

19. The memory device of claim 16 wherein the transistor further includes an first insulating layer located above the storage layer and a second insulating layer located below the storage layer.

20. The memory device of claim 16 wherein the transistor further includes a gate oxide located below the storage layer, the gate oxide having a thickness of between approximately 25 Angstrom to approximately 35 Angstrom.

21. A method for erasing a storage charge in a non volatile memory cell transistor in a memory array, the transistor including a storage layer located above a first insulating layer and below a second insulating layer and including a gate located above the second insulating layer, the method comprising:

performing a tunnel erase on the transistor until a predetermined condition has been met; and performing a hot hole injection erase on the transistor after the performing the tunnel erase.

22. The method of claim 21 further wherein:

the performing the tunnel erase on the transistor until a predetermined condition has been met further includes applying tunnel erase pulses on the transistor until the predetermined condition has been met; and the performing the hot hole injection erase on the transistor further includes applying hot hole erase pulses on the transistor until a second predetermined condition has been met.

23. The method of claim 21 wherein the storage layer includes nitride.

24. The method of claim 21 wherein the performing the tunnel erase on the transistor further includes performing Fowler-Nordheim tunneling.

* * * * *